United States Patent [19]

Coleman

[11] Patent Number: 4,569,719

[45] Date of Patent: Feb. 11, 1986

[54] GLOW DISCHARGE METHOD AND APPARATUS AND PHOTORECEPTOR DEVICES MADE THEREWITH

[75] Inventor: John H. Coleman, Locust Valley, N.Y.

[73] Assignee: Plasma Physics Corporation, Locust Valley, N.Y.

[21] Appl. No.: 637,065

[22] Filed: Aug. 2, 1984

Related U.S. Application Data

[62] Division of Ser. No. 284,333, Jul. 17, 1981, Pat. No. 4,484,809.

[51] Int. Cl.⁴ ............... H01L 21/306; B05D 3/06; C23C 14/00; B44C 1/22
[52] U.S. Cl. ................... 156/643; 118/50.1; 118/620; 118/725; 156/345; 156/646; 156/662; 204/192 EC; 204/192 E; 204/298; 427/39
[58] Field of Search ............ 118/724, 725–730, 118/50.1, 620; 427/39; 156/643, 646, 345, 662; 204/164, 192 E, 192 EC, 298; 355/3 DR

[56] References Cited

U.S. PATENT DOCUMENTS

| | | | |
|---|---|---|---|
| 4,134,817 | 1/1978 | Bourdon | 156/643 X |
| 4,378,417 | 3/1983 | Maruyama et al. | 427/39 X |
| 4,451,547 | 5/1984 | Hirai et al. | 427/39 X |

Primary Examiner—William A. Powell

[57] ABSTRACT

Glow discharge method and apparatus useful for coating electrophotographic photoreceptors in the form of drums and plates are described. Improved photoreceptors using amorphous silicon which accepts a high surface voltage in the dark and discharges to a low residual voltage under illumination are also described.

16 Claims, 10 Drawing Figures

GLOW DISCHARGE METHOD AND APPARATUS AND PHOTORECEPTOR DEVICES MADE THEREWITH

This is a division of application Ser. No. 284,333, filed July 17, 1981, now U.S. Pat. No. 4,484,809.

BACKGROUND OF THE INVENTION

This invention relates broadly to photoreceptors for electrophotography and more particularly to improved photoreceptors which are composed of amorphous silicon having a dielectric layer which increases the surface voltage in the dark while reducing residual voltage under illumination.

The photoreceptor utilizing hydrogenated amorphous silicon (a-Si:H) and a dielectric layer described above is an improvement over a photoreceptor described in my patent application Ser. No. 138,699 now U.S. Pat. No. 4,330,182, a continuation-in-part of U.S. Pat. No. 4,226,897 in which blocking layers were disclosed.

In the past, prior art devices described in U.S. Pat. No. 4,225,222 which issued Sept. 30, 1980, to Kempter described p-n junctions in amorphous silicon for electrophotography. Other amorphous photoreceptors were described by Mort et al in *Photographic Science and Engineering*, Vol . 24, No. 5, pages 241–250. Also, UK Patent Application No. 2,018,466A filed Mar. 2, 1979 by Misumi et al and U.S. Pat. No. 4,265,991 which issued May 5, 1981 to Hirai, described blocking layers on imaging-forming members. Other blocking layers on amorphous silicon photoreceptors were described by Shimizu, Komatsu and Inoue in *Photographic Science & Engineering*, Vol. 24, No. 5, September, 1980, in pages 250–254. These blocking layers increased the dark surface voltage (Vs) but retained substantial surface charge under illumination, thereby reducing voltage contrast.

Apparatus suitable for the present invention using asymmetrical electrical fields is described in my above-mentioned U.S. Pat. No. 4,226,897. Suitable apparatus with uniform electrical fields is described in my U.S. Pat. No. 3,069,283. Improved apparatus is described herein.

SUMMARY OF THE INVENTION

In a series of experiments, I found that when I applied a thin dielectric layer to an a-Si:H photoreceptor by exposing the a-Si:H to activated species of nitrogen using, for example, the method described in my above mentioned U.S. Pat. No. 4,226,897, the dark Vs was increased significantly while the Vs due to residual charge after exposure was reduced to a low value. Although a nitride layer on a-Si:H was found previously to increase the Schottky barrier voltage by a few millivolts, I found that the increase in Vs was in excess of ten volts and higher when the nitride layer applied to the surface of an a-Si:H photoreceptor. In the preferred embodiment, I found that improved photoreceptor properties resulted when a dielectric layer was applied between semiconductor layers. The dielectric layer, when formed either by activated nitrogen species or by a glow discharge in silane and ammonia, was blocking to charge carriers flowing in the dark, but was substantially conducting to charge carriers generated by electromagnetic radiation analagous to a rectifier. The semiconductor layers included p-doped, n-doped, and intrinsic layers of a-Si:H.

Furthermore, a photoreceptor was produced capable of both positive and negative charging by applying a P-doped a-Si:H layer, nitride of silicon layer, and intrinsic layer sequentially to an aluminum drum. When the photoreceptor drum was substituted for a selenium alloy drum in a commercially available electrostatic office copier with liquid toner, high quality image reproduction was attained. The image resolution was exceptionally high since there is no detectable grain in the a-Si:H, and the residual charging was low. Also, other problems were eliminated which are usually associated with photoreceptors, such as, for example, reverse charging when its surface area was brushed to remove toner during the cleaning cycle.

In addition, improved apparatus is described herein which is particularly useful for plasma coating photoreceptor drums and tape in production quantities.

Thus, one object of the present invention is to increase the dark surface voltage accepted by a photoreceptor composed of a-Si:H. Another object is to reduce the residual charge on an a-Si:H photoreceptor under illumination. Still another object is to provide an improved electrophotographic system. Also an objective is to provide a rectifying barrier in a photoreceptor which is blocking to charge flowing in the photoreceptor while in the dark, and is conducting to charge generated under illumination. Finally, another object is to provide improved glow discharge process and apparatus having high disposition rates.

BRIEF DESCRIPTION OF THE DRAWINGS

Reference is now made to the drawings in which.

DESCRIPTION OF THE APPARATUS AND TECHNIQUES

Figure 1:
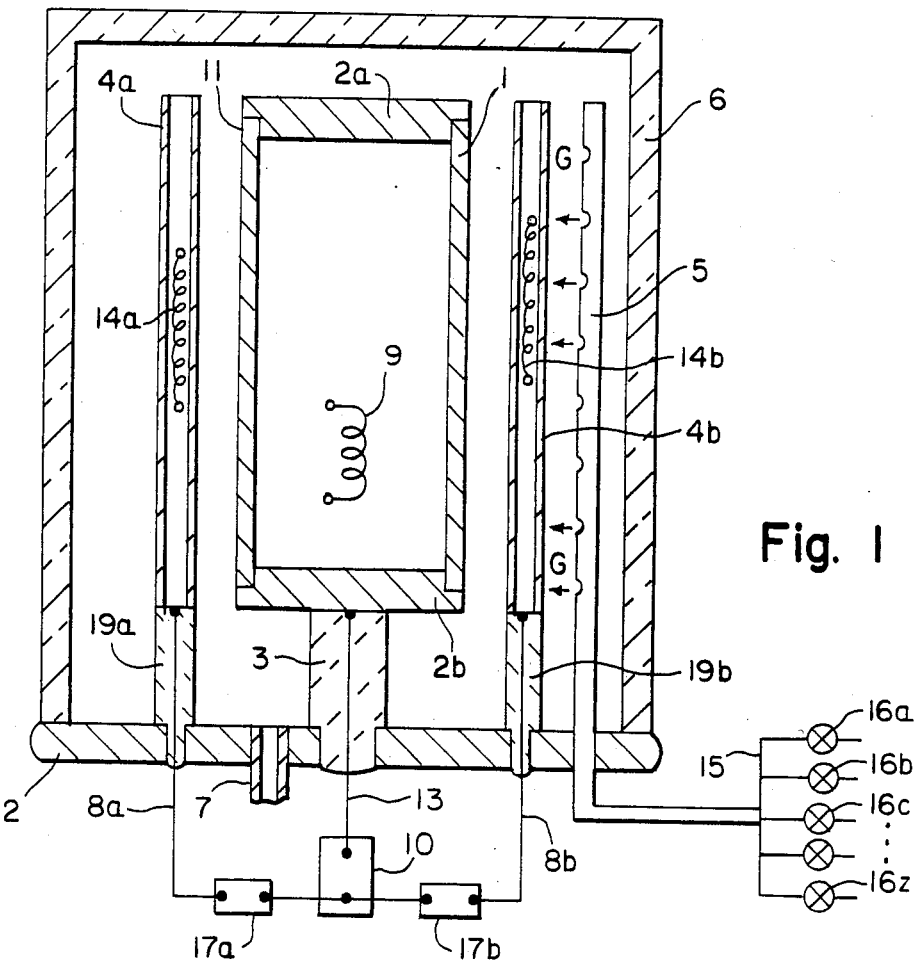
FIG. 1 is a side view in cross-section illustrating schematically the glow discharge apparatus for coating cylindrical drums.

Referring to FIG. 1, a cross-sectional view is illustrated schematically of glow discharge apparatus positioned on a header plate 12 which is hermetically sealed to an enclosure 6. Substrate 1 is a cylindrical drum of aluminum having an outer surface 11 to be coated. End discs 2a, b are fitted into the open ends of cylindrical substrate 1. Disc 2b is mounted on center conductor 13 of ceramic post 3 which electrically connects the substrate 1 to the negative terminal of a power supply 10. Ceramic post 3 is hermetically sealed into header 12. Counter electrodes 4a, b of, say, stainless steel tubing, are supported by ceramic posts 19a, b respectively, posts 19a, b being hermetically sealed into header 12. The center conductors 8a, b of posts 19a, b electrically connect the counter electrodes 4a, b respectively to the positive terminal of power supply 10 through protective impedances 17a, b respectively. Heating element 9 mounted inside cylindrical substrate 1 is electrically connected through suitable terminals (not shown) to an external power source (not shown). Heating elements 14a, b are mounted inside counter electrodes 4a, b and are connected through suitable terminals (not shown) in header 12 to an external power source (not shown).

Next, as illustrated in FIG. 1, gases G from gas supply tanks (not shown) are introduced into enclosure 6 through appropriate flow controllers 16a, b . . . z, then through line 15, hermetic fitting 14 in header 12, and line 5. Enclosure 6 is evacuated through tubing 7 by a vacuum pump (not shown).

In operation, the atmosphere in enclosure 6 is evacuated through tubing 7 to a pressure of about 0.1 Torr or less and the enclosure 6 is back-filled with the desired film-forming gases G. Various coatings may be produced in the apparatus of FIG. 1 such as, for example, the photoreceptor illustrated in FIG. 2.

Figure 2:
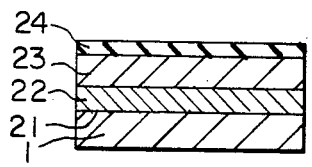
FIG. 2 is a side view in cross-section of one embodiment of an amorphous silicon photoreceptor of exaggerated thickness made with the apparatus of FIG. 1.

Referring now to FIG. 2, which illustrates crosssectionally a photoreceptor coated, for example, on the aluminum drum substrate 1 illustrated in the apparatus of FIG. 1. Here the substrate surface 21 is coated first with an n-type layer 22 of a-Si:H using gases G consisting of a mixture of silane ($SiH_4$) and phosphine ($PH_3$). The P/Si mixture, which is in the ratio of 0.01% to 1% or greater, is admitted into line 5 by adjusting the mass flow controllers 16a, b. The gases G may be diluted, for example, to 5% $SiH_4$ in He and 1% $PH_3$ in He and operated in the pressure range of 1 to 3 Torr. The temperature of substrate 1 is maintained at 230° C. or higher by adjusting the current to heater 9. Counter electrodes 4a, b may be 200° C. or higher by adjusting heaters 14a, b to increase the electrical conductivity of the material deposited on the surfaces of counter electrodes 4a, b during deposition which would otherwise impede the flow of current from the plasma to the anodes 4a, b. The layer 22 may be coated to 300 Å and thicker by adjusting voltage V to about 360 volts and maintaining a current density of 0.1 mA/cm$^2$ for about one minute or longer.

Next, the phosphine flow valve 16b is closed and the $SiH_4$ continues to form an intrinsic a-Si:H layer 23 to attain the desired thickness, dependent on the desired operating voltage. Finally, the $SiH_4$ valve 16a is closed and the enclosure 6 is evacuated. $NH_3$ is admitted next through valve 16c to a pressure of about 0.2 Torr and the glow discharge continued for about 30 minutes with power source 10 adjusted to 300 volts and the current I of 0.1 mA/cm$^2$ and higher, thereby forming a nitride of silicon layer 24 in a similar manner to that described in my above mentioned U.S. Pat. No. 4,226,897.

Under test using a one micron thick a-Si:H layer 23, the surface voltage Vs charged to −30 volts in the dark with a conventional Corotron corona charger. No positive charging was noted. Without the nitride layer 24, Vs charged to only about −15 volts with the same thickness of a-Si:H layer 22. Next, under illumination of 0.2 microjoules at 550 nm, the Vs decreased to approximately zero. Finally, the substrate drum 1 was removed and inserted into a commercially available electrophotographic office copier in place of the conventional selenium drum. When the drum 1 was negatively charged, exposed, and developed with liquid toner by the Carlson method, it produced high quality toned images which transferred to standard paper.

Thus, in the dark, the nitride layer appears to block the flow of holes from the aluminum substrate as well as to block the holes which are generated thermally in the a-Si:H layer from flowing to the surface. Significantly, the charge carriers generated by illumination appear to tunnel through nitride layer 24 and discharge the Vs to a low value, indicating that the dielectric layer possesses rectification properties.

Figure 3:
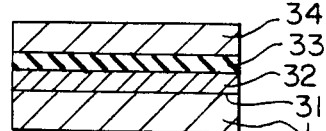
FIG. 3 is a side view in cross-section of a second embodiment of an amorphous silicon photoreceptor of exaggerated thickness.

Next, referring to FIG. 3, a photorecepter is illustrated cross-sectionally having a surface 31 of the substrate 1 which, for example, may be the aluminum drum illustrated in FIG. 1. First, a p+ layer 32 is deposited on surface 31 in the apparatus of FIG. 1 having a B/Si ratio preferably in the range of 0.01% to 1% with a thickness range of 300 to 10,000 Å. During deposition the temperature is maintained in the range of 250° to 450° C. The higher temperatures are preferred initially for best adhesion to the substrate surface 31, after which the temperature is preferably reduced to 250° C. At the higher temperatures, chemical vapor deposition (CVD) was noted to occur by pyrolysis on substrate surface 31 and, indeed, suitable p+ layers 32 were produced at 450° C. without applying the glow discharge. A nitride of silicon layer 33 was then produced on p+ layer 32 by a glow discharge in $NH_3$ for 30 minutes, as described above. Finally, the temperature of substrate 1 was held at 250° C. and an intrinsic a-Si:H layer 34 of about 5 microns thickness was plasma deposited on the nitride layer 33 by a glow discharge in silane, thereby forming the sequence: Intrinsic a-Si:H/dielectric/p+ a-Si:H.

Under test, the photoreceptor illustrated in FIG. 3 with a 5 micron thick intrinsic a-Si:H layer 34 charged to Vs of +80 volts. Surprisingly, the same photoreceptor charged Vs to −110 volts. Both polarities of Vs discharged to a few volts under illumination of 2 microjoules at 550 nm. Without the nitride layer 33, Vs on layer 34 charged in the dark to less than +25 volts, and charged negatively to only a few volts. The dielectric layer 33 appears to block charge carriers present in the dark, while to be conducting to charge carriers generated by electromagnetic radiation when charged to either polarity. Thus, the dielectric film has properties analagous to a rectifier, except that the effect is independent of polarity.

Indeed, a top semitransparent electrode of Cr was evaporated on the intrinsic a-Si:H layer 34 to form a photodiode structure; and, when an external voltage of 10 volts was applied between the semitransparent electrode and substrate, the charge carriers flowing in the dark were less than a microamp, whereas under illumination several milliamps were measured.

Next, the gases G containing a mixture of silane and $NH_3$ were admitted simultaneously during the glow discharge forming a $Si_xN_y$ dielectric film. The discharge was maintained for about 6 minutes to deposit a 1000 Å $Si_xN_y$ layer 33 on p layer 32. Similar dark Vs and illuminated discharge values were obtained to those described above when the dielectric layer 33 was produced by discharging in NH₃ alone.

In addition to producing positive and negative charging, the photoreceptor illustrated in FIG. 3 is the preferred embodiment of the invention, since the dielectric layer 33 is positioned between two semiconductor layers and, therefore, dielectric layer 33 is protected from the mechanical wear involved during the toning, image transfer, and cleaning cycles of the Carlson process. Also under test in a commercial electrophotographic copy machine, high quality images were produced.

Figure 4:
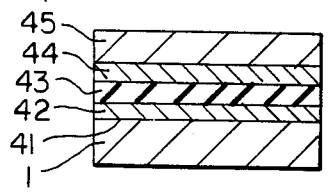
FIG. 4 is a side view in cross-section of a third embodiment of an amorphous silicon photoreceptor.

Referring to FIG. 4, a p-type layer 42 is applied to the surface 41 of substrate 40, after which a $Si_xN_y$ layer 43 is applied to the surface of layer 42, as described in connection with FIG. 3. An n-type layer 44 in the range of 300 to 10,000 Å thich was applied to the surface of a $Si_xN_y$ layer 43 and an intrinsic a-Si:H layer 45 applied to the layer 44. Thus the photoreceptor had the layers applied sequentially: intrinsic a-Si:H/n a-Si:H/dielectric/p a-Si:H/metal substrate.

Under corotron charging, negative Vs of −20 volts was accepted by layer 44 of one micron thickness. No positive charging was observed since the negative majority carriers in the n-type layer in layer 44 drift to a positive charge. However, the dielectric layer 43 increased the Vs by blocking holes from the p-layer and from the substrate 1. Again, there is no residual voltage under illumination since the photo-induced charge carriers appear to tunnel through dielectric layer 42.

Figure 5:
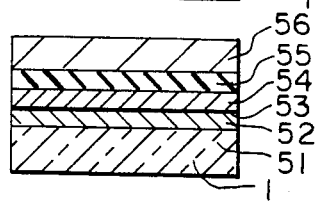
FIG. 5 is a side view in cross-section of an amorphous silicon photoreceptor deposited on a semi-transparent substrate.

Now, referring to FIG. 5, the substrate 1 is a glass plate 51 with a semi-transparent, conducting-metal-oxide coating 52 composed of, for example, fluorinated tin oxide 1500 Å thick. The coating 52 may be coated with a protective layer 53 of 30 Å silicon oxide formed by oxidizing a plasma deposited a-Si:H layer.

Next, with the substrate 1 held at 250° C. the layers described in connection with FIG. 3 were applied sequentially to the oxide layer 53; i.e., a p-type a-Si:H layer 54, a nitride layer 55, an intrinsic a-Si:H layer 56.

In operation the photoreceptor illustrated in FIG. 5 charged to Vs of +50 volts and −70 volts in the dark and discharged to a low value under illumination as low as 0.2 microjoules/cm² when the thickness of the intrinsic a-Si:H layer 56 was similar to that described in connection with FIG. 3.

The device illustrated in FIGS. 2–5 were next plasma deposited in the apparatus illustrated in my U.S. Pat. No. 3,069,283 using a uniform electric field, and similar results were found to those described above. Also, the silane used to produce the intrinsic, n-type, and p-type layers was replaced with the following gases: disilane, fluorosilane, and fluorodisilane. In each case the photoreceptor produced similar results under test to those obtained with silane-He mixture. Also, when the power source 10 illustrated in FIG. 1 was charged to 60 Hz, audio frequencies from 60 to 20 Hz or radio frequencies from 20 Hz to 200 MHz and photoreceptors were produced such as illustrated in FIGS. 2–5, similar results were found. Finally, a-Si:H produced by sputtering or evaporating Si in a hydrogen atmosphere gave similar results.

Figure 6:
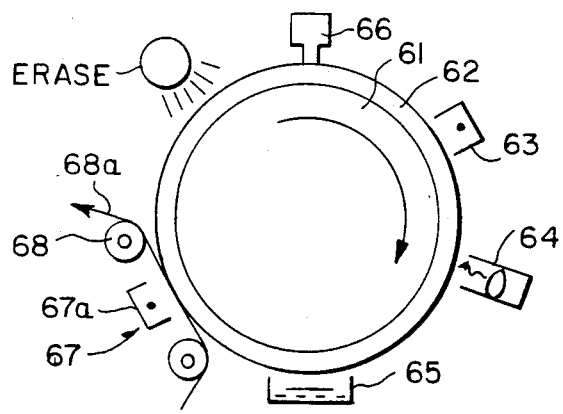
FIG. 6 is a side view in cross-section of an electrophotographic copy machine using the amorphous silicon photoreceptor of FIG. 3.

Referring to FIG. 6, a cross-sectional view of an electrostatic copier particularly suited to the present photoreceptor is illustrated schematically. A rotating drum 61 mounted on an appropriate shaft moves the a-Si:H photoreceptor 62 produced, for example, as described in connection with FIG. 3. Positioned around the periphery of drum 61 are corotron charging unit 63, exposure station 64, toner development system 65 with its development electrode adjusted to the appropriate potential, paper transfer station 67 with appropriate transfer corona 67a, and cleaning station 66. Paper feed rollers 68 hold the paper 68a against the drum under the transfer corona station 67 as is well known in the art. An erase lamp may be used as illustrated.

In operation with an a-Si:H photoreceptor such as described in connection with FIG. 3, high quality images were obtained with a Vs as low as 80 volts when a typewritten letter was imaged onto the surface of photoreceptor 62. When an insulating Mylar belt was added to the surface of photoreceptor 62 and a corona charger (not shown) was added to the exposure station, good images were obtained for Vs as low as 50 volts.

Next, referring to the exposure station 64, the optics for imaging a page onto photoreceptor 64 were removed and a He-Ne laser (not shown) was installed in the exposure station 64 and raster scanned across the a-Si:H surface 61, while being modulated with an accousto-optic modulator in accordance with a data stream as is known in the art. Again, high resolution spots or images were transferred to he paper with a conventional treated surface for liquid toner. Both analog images and digital spots were recorded successfully.

Figure 7:
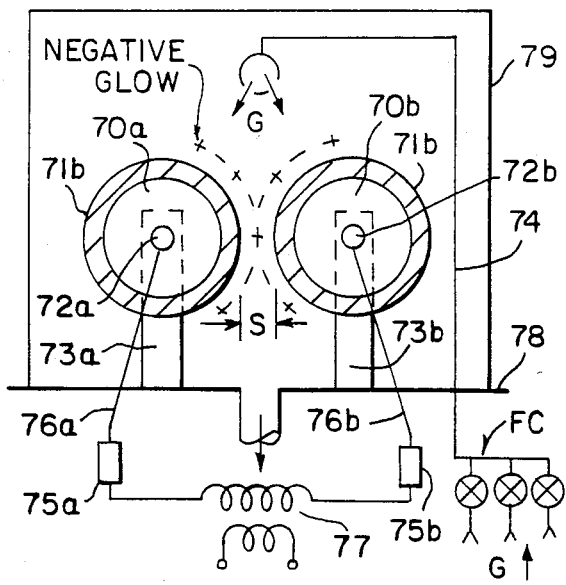
FIG. 7 is a side view in cross-section illustrating schematically glow discharge apparatus for coating cylindrical drums.

Finally, referring to FIG. 7, a cross-sectional view of glow discharge apparatus mounted in enclosure 79 hermetically sealed to header 78 is illustrated schematically. A pair of drum electrodes 70a, b are connected by leads 76a, b respectively to an electrical transformer 77. Electrodes 71a, b alternatively function as anode and cathode during each half cycle of the voltage induced on transformer 77. Drum electrodes 70a, b are supported by shafts 72a, b mounted in bearings (not shown) which are supported on the header plate 78 by insulated blocks 73a, b respectively. Drums 70a, b have surface 71a, b to be plasma coated from film-forming gases. The transformer 77 is connected to the drums 70a, b through protective impedances 75a, b and leads 76a, b which may be conveniently connected to the shafts 72a, b respectively through bearings (not shown) or other sliding contacts. Film-forming gases G are introduced as illustrated into the vicinity of drums 70a, b from line 74 and appropriate flow controllers FC and feed tanks (not shown).

Operation of the deposition system of FIG. 7 is similar to that of FIG. 1 in that the film forming gases are introduced into the region of the drum surfaces 71a, b through line 74 and flow controllers FC from tanks (not shown), after which the voltage from transformer 77 is adjusted to maintain a glow-dicharge with the desired current density ranging from 0.1 mA/cm² and higher. However, both electrodes 70a, b have substrate surfaces 71a, b to which the coatings are applied on alternate cycles, thereby eliminating the necessity for a counter electrode which otherwise would wastefully collect some deposit. The frequency of the power from a power source (not shown) applied to transformer 77 may be in the range of 60 Hz to 100 MHz with appropriate matching networks. The drums may be rotated by an external motor (not shown) and drive shafts (not shown) to produce a uniform discharge. Although the cathode glow around the drum surface 71a or b connected during its negative half cycle can be adjusted to produce a uniform deposition, the opposing drum 71a or b is anodic for that half cycle, and its deposit occurs on the area closest to the cathode. However, rotation of drums 71a, b then produces uniform coatings.

In tests, all analog and homolog molecules of silane, H₂, and the hologens were found to produce useful films as well as dopants and other film-forming gases available commercially.

Figure 7A:
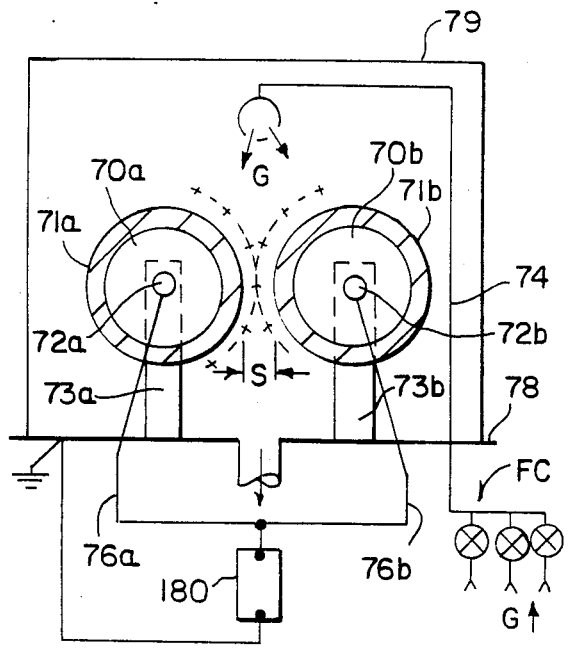
FIG. 7a is a side view in crossection illustrating schematically glow discharge apparatus for coating cylindrical drums between which the negative glow regions interact.

In addition, referring to FIG. 7A I found that when leads 76a, b electrically connected both the drums 70a, b to the negative terminal of D.C. power supply 180 while the positive terminal was connected to header 78 or metallic gas line 74, an improved glow discharge occurred in the drum surfaces 71a, b. Indeed, when the separation S between the surfaces 71a, b, as designated by "S" in FIG. 7A was varied and the current was maintained constant, the voltage required to sustain the glow discharge decreased when the separation S was adjusted so that the cathode glows above surfaces 71a, b approached one another. Under these conditions less power is required and better film quality in surfaces 71a, b was attained.

In operation, the heaviest deposit was noted to occur in the region of closest separation; however, nonuniformity in thickness was averaged out by rotation of drums 70a, b as shown. Similar results were obtained with a pulsating D.C. supply 180 and with an A.C. or R.F. supply with a negative bias preferably on drums 70a, b.

Figure 8:
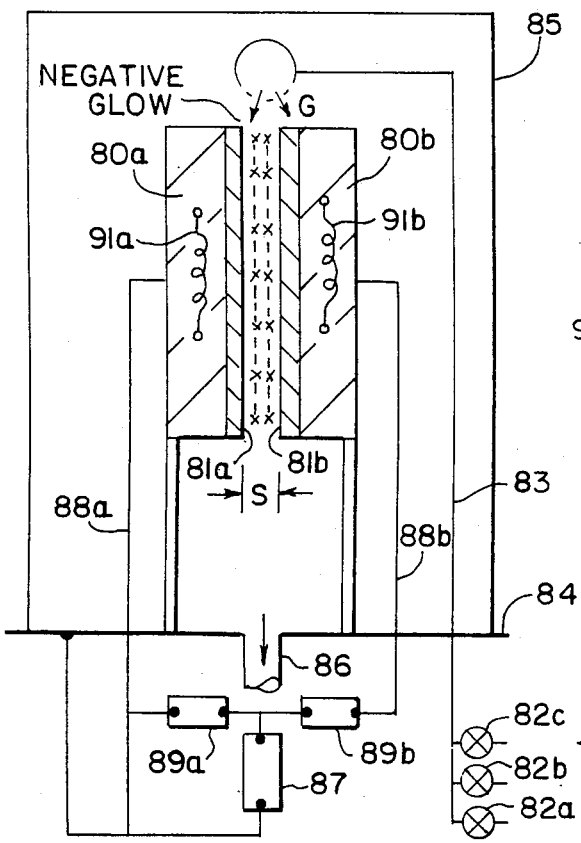
FIG. 8 is a side view in cross-section illustrating schematically glow discharge apparatus for coating planar members.

Finally, referring to FIG. 8, the drums 70a, b illustrated in FIG. 7A were replaced with flat plate substrates 80a, b, having a separation S between opposing surfaces 81a, b. As described above, film forming gases from tanks (not shown) are admitted through flow controllers 82a, b, c, through line 83 in header 84 into the vicinity of substrate surfaces 81a, b. The enclosure 85 is pumped through line 86 by a vacuum pump (not shown) as described above. One terminal of a power supply 87 is connected through leads 88a, b to substrate 80a, b respectively through protective impedances 89a, b. The other terminal of power supply 87 is connected to header or to gas supply lead 83 which acts as the counter electrode. Heaters 91a, b in substrates 80a, b are powered by an external power source (not shown) to maintain the desired substrate temperature, or an external source may radiantly heat substrates 80a, b.

In operation, the desired film forming gases such as, for example, silane and its dopants, as described in connection with FIG. 3, are admitted through line 83 into the enclosure 85. The power supply 87 may be pulsating D.C. with the most negative polarity connected through leads 88a, b to substrates 80a, b to maintain a glow discharge around substrate surfaces 81a, b. When the separation S is adjusted to position the negative glow regions above surfaces 81a, b in close proximity to one another, the voltage from power source 87 required to maintain the same current was observed to decrease. For example, using 4"×8" aluminum plate substrates 80a, b, and 5% silane in He at 2 Torr pressure, the voltage required to sustain 50 mA decreased from 360 to 340 volts when the separation S was decreased from 2 inches to 1 inch.

Under test, uniform films with good semiconductor properties were noted. Other gases gave similar results provided the cathode glows on the substrate surfaces were adjusted in close or overlapping proximity. (The effect was useful until the separation S was so small the glow discharge was extinguished.) Under such conditions the apparatus illustrated in FIG. 8 was found to deposit improved a-Si:H films from silane, disilane, SiF₄, difluorosilane and various combinations of dopants including hydrogen, fluorine, diborane, phosphine and arsine. Other semiconductor gases found to deposit improved films included germane and trimethyl gallium with arsine.

In addition, when a silicon wafer was placed on surface 81a and/or 81b of electrode 80a and/or 80b in the apparatus illustrated in FIG. 8 and the reactive gases that are etchants of Si such as, for example, $CH_4$ and $O_2$, were introduced through tube 83, rapid etching of Si, $SiO_2$ and $Si_3N_4$ was observed under glow discharge. Also, $BCl_3$ was found to etch Al layers on Si. Introduction of $O_2$ alone was found to form $SiO_2$ on a Si wafer during a glow discharge and the addition of a few percent of $CF_4$ enhanced the oxidation rate. Although this etching reaction is similar to that known in the art, the apparatus of FIG. 8 was found to reduce the power required to operate in a stable manner at lower pressures and to produce better anisotropic etching than conventional parallel planar reactors or inductively coupled reactors.

Figure 9:
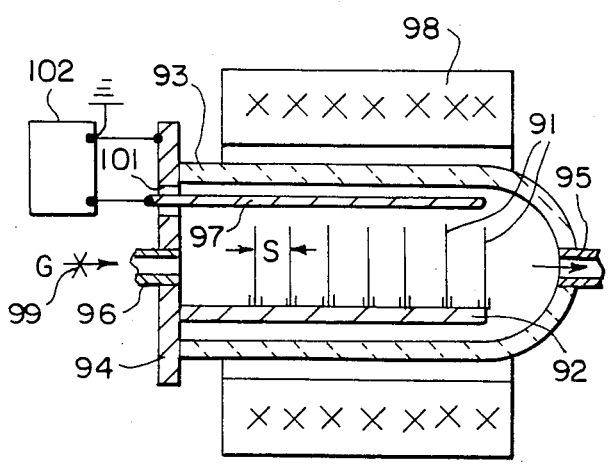
FIG. 9 is a cross-sectional of multiple planar substrates.

Referring to FIG. 9, substrates 91, such as Si wafers, are held in a conducting tray 92 which is electrically connected to header 94 and to ground. Header 94 forms a vacuum-tight enclosure with quartz tube 93 by means of a gasket (not shown). The conducting wafer tray 92 may be cantilevered from header 94. An IR oven 98 positioned around quartz tube 93 may be used to radiantly heat substrate 91. Gases G are admitted from tanks (not shown) and flow controller 99 through tubing 96 in header 94 and past substrates 91. The reaction by-products of gases G are exhausted through tubing 55 by a vacuum pump (not shown).

To provide an electric field to substrates 91, a counter electrode 97 in the form of nickel tubing is mounted on an electrical feed-through 101 in header 94. The center conductor of feed through 101 may be connected to the positive terminal of a power supply 102, the negative terminal of which may be grounded to header 94.

Again, as described in connection with FIG. 7 and FIG. 8, the separation S between substrates 91 is adjusted for the desired pressure of gases G to maintain the cathode glow regions above juxtaposed surfaces of substrates 91 to be in sufficiently close proximity to interact and reduce the voltage required for deposition of etching. Substrates 91 may be of any desired material instead of the Si wafers and gases G may be any mentioned above or others, deposition or etching being determined by the gases G being used. Also, pulsating D.C., A.C., or R.F. power supplies may be used between substrates 91 and counter electrode 97, although the enhanced glow discharge only occurs during the portion of the voltage cycles in which substrates 91 are negative relative to counter electrode 97.

In addition to using the well known Carlson method of toning the electrostatic images on the photoreceptors, I found that by coating the photoreceptors illustrates in FIGS. 2-5 with a conventional thermoplastic polymer and corona charging, a physical image was produced in the polymer. Specifically, when the photoreceptor was exposed to a light image from, say, a laser beam, the surface charge was selectively discharged. The application of heat to the softening point of the polymer then permitted the portion of the surface which retained charge to physically deform in accordance with the charge pattern. The pattern was then read by a laser, as is known in the art.

I claim:

1. Apparatus for producing a semiconductor film on the surface of a substrate comprising an evacuable enclosure, means for evacuating said enclosure, means for introducing into the evacuated enclosure a gaseous semiconductor film forming material at subatmospheric pressure in the region of said substrate, counter-electrode means disposed within said enclosure in the region of said substrate, a source of electrical potential for providing an electric field between said counter electrode means and said substrate, means for controlling the pressure of said gaseous semiconductor film forming material so as to maintain a glow discharge in the region of said substrate, and means for heating said counter-electrode means so as to increase the conductivity of said semiconductor material so as to increase the uniformity of the glow discharge so as to produce a substantially uniform semiconductor film on the surface of said substrate.

2. Apparatus of the type described in claim 1 wherein said substrate comprises a cylinder, and further comprising means for rotating said cylindrical substrate about its axis so as to provide a uniform semiconductor coating on the surface of said cylindrical substrate.

3. Apparatus of the type described in claim 2 wherein said counter-electrode means comprises a plurality of anode members, each of said anode members being individually ballasted.

4. Apparatus of the type described in claim 2 wherein said counter-electrode means comprises a second cylinder.

5. Apparatus for producing a semiconductor film on the surfaces of articles comprising an evacuable enclosure, means for evacuating said enclosure, electrode means for holding within said enclosure a plurality of articles separated from each other by a distance, means for introducing into the evacuated enclosure a gaseous film forming material at subatmospheric pressure in the region of the articles, counter-electrode means for applying an electric field to a pair of the said articles within said enclosure, means for controlling the pressure to maintain the negative glow region of a glow discharge adjacent the surfaces of the articles, the distance separating the articles being sufficiently short that the negative glow regions interact to reduce the voltage required to maintain the glow discharge.

6. Apparatus of the type described in claim 5 wherein one of said articles comprises a cylindrical substrate and further comprising means for rotating said cylindrical substrate abou its axis so as to provide a uniform semiconducting coating on the surface of said cylindrical substrate.

7. Apparatus of the type described in claim 5 wherein said articles are planar members.

8. The apparatus of claim 5 wherein heating means maintains the temperature of said articles in a range to produce a high dark resistivity in said film.

9. Apparatus of the type described in claim 5 wherein said gaseous film forming material comprises silicon and hydrogen.

10. The method of producing a film on a plurality of articles in an evacuable enclosure, which includes the steps of evacuating said enclosure, introducing a gaseout material at subatmospheric pressure in the region of said articles, applying an electric field between a counter electrode and a pair of said articles spaced apart by a separation, and controlling said pressure in relation to said separation to maintain negative glow region of a glow discharge adjacent the surfaces of said articles, the distance separating said articles being sufficiently short that the negative glow regions interact to reduce the voltage required to maintain the glow discharge.

11. The method of claim 10 further comprising the step of heating the articles to be coated.

12. The method of claim 10 wherein said gaseous film forming material comprises silicon and hydrogen.

13. The method of etching a plurality of articles in an evacuable enclosure which includes the steps of evacuating said enclosure, introducing a gaseous material comprising a reaction gas at subatmospheric pressure in the region of said articles, applying an electric field between a counter electrode and a pair of said articles spaced apart by a separation, and controlling said pressure in relation to said separation to maintain the negative glow region of a glow discharge adjacent the surfaces of said articles, the distance separating said articles being sufficiently short that the negative glow regions interact to reduce the voltage required to maintain the glow discharge.

14. The method of claim 13 wherein said articles comprise silicon wafers.

15. Apparatus for etching a plurality of articles comprising an evacuable enclosure, means for introducing into said enclosure gaseous material comprising a reactive gas at subatmospheric pressure in the region of said articles, counterelectrode means for applying an electric field to a pair of the said articles within said enclosure, means for controlling the pressure to maintain the negative glow region of a glow discharge adjacent the surfaces of the articles, the distance separating the articles being sufficiently short so that the negative glow regions interact to reduce the voltage required to maintain the glow discharge.

16. The apparatus of claim 15 wherein said articles comprise silicon wafers.

* * * * *